(12) United States Patent
Sun et al.

(10) Patent No.: US 8,822,951 B2
(45) Date of Patent: Sep. 2, 2014

(54) MANIPULATOR CARRIER FOR ELECTRON MICROSCOPES

(76) Inventors: Yu Sun, Toronto (CA); Changai Ru, Toronto (CA); Yong Zhang, Toronto (CA)

( * ) Notice: Subject to any disclaimer, the term of this patent is extended or adjusted under 35 U.S.C. 154(b) by 44 days.

(21) Appl. No.: 13/639,737

(22) PCT Filed: Apr. 7, 2010

(86) PCT No.: PCT/CA2010/000521
§ 371 (c)(1),
(2), (4) Date: Jan. 7, 2013

(87) PCT Pub. No.: WO2011/123923
PCT Pub. Date: Oct. 13, 2011

(65) Prior Publication Data
US 2013/0099134 A1    Apr. 25, 2013

(51) Int. Cl.
*H01J 37/26* (2006.01)
*H01J 37/20* (2006.01)
*H01J 37/28* (2006.01)
*H01J 37/18* (2006.01)

(52) U.S. Cl.
CPC ........... *H01J 37/20* (2013.01); *H01J 2237/204* (2013.01); *H01J 2237/208* (2013.01); *H01J 37/28* (2013.01); *H01J 2237/2008* (2013.01); *H01J 2237/206* (2013.01); *H01J 37/185* (2013.01); *H01J 2237/2007* (2013.01)
USPC ............ 250/442.11; 250/441.11; 250/440.11; 250/307; 250/310; 250/311

(58) Field of Classification Search
USPC ............ 250/306, 307, 309, 310, 311, 440.11, 250/441.11, 442.11, 443.1, 491.1, 492.1, 250/492.3
See application file for complete search history.

(56) References Cited

U.S. PATENT DOCUMENTS

| | | | |
|---|---|---|---|
| 4,427,891 A * | 1/1984 | Georges et al. | ............ 250/443.1 |
| 5,568,004 A | 10/1996 | Kleindiek | |

(Continued)

FOREIGN PATENT DOCUMENTS

| | | |
|---|---|---|
| DE | 102007035950 | 11/2008 |
| JP | 2001077180 | 3/2001 |

(Continued)

OTHER PUBLICATIONS

Yu, Min-Feng et al, Strength and Breaking Mechanism of Multiwalled Carbon Nanotubes Under Tensile Load, Sience, Jan. 28, 2000, p. 637-640, vol. 287, American Association for . . . .

(Continued)

*Primary Examiner* — Nicole Ippolito
(74) *Attorney, Agent, or Firm* — Edward Krupnik

(57) ABSTRACT

The present invention relates to a carrier device for transporting one or more manipulators into a vacuum specimen chamber of an electron microscope, characterized in that the carrier device comprises: (i) a platform having securing means for detachably securing the one or more manipulators to the platform, and (ii) electrical connectors secured to the platform for the electrical connection of the one or more manipulators. The present invention also relates to a method for transporting the carrier device into the vacuum specimen chamber of the electron microscope without altering the vacuum of the vacuum specimen chamber comprising transporting the carrier device of the invention through the specimen exchange chamber of the electron microscope and into the vacuum specimen chamber.

16 Claims, 13 Drawing Sheets

(56) References Cited

U.S. PATENT DOCUMENTS

| | | | |
|---|---|---|---|
| 5,994,820 | A | 11/1999 | Kleindiek |
| 6,476,537 | B1 | 11/2002 | Pease et al. |
| 6,580,076 | B1 | 6/2003 | Miyazaki |
| 6,661,153 | B1 | 12/2003 | Shiv et al. |
| 6,707,231 | B2 | 3/2004 | Pease et al. |
| 6,800,894 | B1 | 10/2004 | Furuhata |
| 6,891,170 | B1 | 5/2005 | Yu et al. |
| 7,043,848 | B2 | 5/2006 | Hollman et al. |
| 7,220,973 | B2 | 5/2007 | Yu et al. |
| 2004/0245466 | A1 | 12/2004 | Robinson et al. |
| 2008/0073562 | A1* | 3/2008 | Suzuki .................. 250/440.11 |

FOREIGN PATENT DOCUMENTS

| | | |
|---|---|---|
| JP | 2004085477 | 3/2004 |
| WO | WO2008128532 A2 | 10/2008 |
| WO | WO2009037693 A1 | 3/2009 |

OTHER PUBLICATIONS

Aoki, Kanna, et al, Microassembly of semiconductor three-dimenstional photonic crystals, Nature Materials, Feb. 2003, p. 117-121, vol. 2, Nature Publishing Group.

Pawley, James B., A Dual Needle Piezoelectric Micromanipulator for the Scanning Electron Microscope, Review of Scientific Instruments, Apr. 1972, p. 600-602, vol. 43:4, AIP.

Kawabata, Isuzu, Microdissection within SEM Using New Micromanipulator, J. Electron Micros., Jan. 1981, p. 85-88, vol. 30, No. 1.

Fukuda, Toshio, et al, Nanofabrication, Nanoinstrumentation and Nanoassembly by Nanorobtic Manipulation, The International Journal of Robotics Research, Mar. 18, 2009, p. 537.

Nakabayashi, D. et al, Inexpensive two-tip nanomanipulator for a SEM, Applied Surface Science, Jul. 18, 2007, p. 405-411, vol. 254, Elsevier B.V.

Yu, Minfeung et al, Three-dimensional manipulation of carbon nanotubes under a scanning electron microscope, Nanotechnology, Jan. 18, 1999, p. 244-252, vol. 10, IOP Publish . . . .

Kortschack, A. et al, Development of mobile verstile nanohandling microrobots: design, driving principles, haptic control, Robotica, 2005, p. 419-434, vol. 23, Cambridge Univ . . . .

Fatikow, Sergej et al, Microrobot System for Automatic Nanohandling inside a Scanning Electron Microscope, IEEE Intl Conf. on Robotics and Automation, May 2006, p. 1402-1407 . . . .

* cited by examiner

MANIPULATOR CARRIER FOR ELECTRON MICROSCOPES

CROSS REFERENCE TO RELATED APPLICATIONS

This application is a national stage application under 35 U.S.C. 371 of international Application No. PCT/CA PCT/CA2010/000521, filed Apr. 7, 2010, the contents of which a hereby incorporated by reference into the present disclosure.

FIELD OF THE INVENTION

The present invention relates to a system for the manipulation and testing of samples at the micrometer and nanometer scales inside an electron microscope. More particularly, the present invention relates to a manipulator carrier for electron microscopes, a system for transporting the manipulator carrier into the electron microscope and to methods of transporting the manipulator carrier of the invention into the electron microscope.

BACKGROUND OF THE INVENTION

Since scanning electron microscopy (SEM) provides an image resolution down to a few nanometers and a relatively high frame rate in comparison to atomic force microscopy, manipulators have been installed inside scanning electron microscopes (SEM) for the dissection, manipulation, or testing of samples at the nanometer scale. For instance, a nanomanipulator was built and used in tensile-loading individual carbon nanotubes inside an SEM in order to characterize their mechanical properties (M.-F. Yu, O. Lourie, M. J. Dyer, K. Moloni, Thomas F. Kelly, and R. S. Ruoff, "Strength and breaking mechanism of multiwalled carbon nanotubes under tensile load," Science, vol. 287, pp. 637-640, 2000). Also inside an SEM, a micromanipulator was employed to assemble prefabricated photonic plates into a novel three-dimensional photonic crystal (K. Aoki, H. T. Miyazaki, H. Hirayama, K. Inoshita, T. Baba, K. Sakoda, N. Shinya, and Y. Aoyagi, "Microassembly of semiconductor three dimensional photonic crystals," Nat. Mater., vol. 2, pp. 117-121, 2003). U.S. Pat. No. 6,580,076 discloses a micromanipulation method for pick-and-place of micro objects with high repeatability inside an SEM.

Due to the aforementioned enabling capabilities, several nanomanipulation systems for SEM have been developed since 1970s by companies and university laboratories. Initially, a manipulator was mounted to either the specimen exchange chamber of an SEM (J. B. Pawley, "A dual needle piezoelectric micromanipulator for the scanning electron microscope," Rev. Sci. Instrum., vol. 43, pp. 600-602, 1972) or a vacuum feedthrough on the chamber wall (I. Kawabata, Y. Nomura, and S. Shuto, "Microdissection within SEM using new micromanipulator," J. Electron Microsc, vol. 30, pp. 85-88, 1981). In those two installation approaches, the XYZ driving elements of the manipulator were all located outside the specimen chamber while only the end effecter was inserted inside. Moreover, they both have the limitation that neither the specimen exchange chamber nor the feedthrough is able to accommodate more than one manipulator.

Since many applications of SEM nanomanipualtion require the collaboration of two or more manipulators, most present nanomanipulation systems have multiple manipulators mounted onto a platform/fixture which is fastened to the specimen stage inside an SEM. U.S. Pat. No. 6,891,170 and No. 7,220,973 B2 (Zyvex Corporation) disclose a manipulation system that includes one or more detachable manipulator modules coupled to a platform that interfaces with a microscope stage. Among several nanomanipulation systems developed by Zyvex Corporation, for example, the Zyvex S100 system contains four nanomanipulators and can be used for physical property characterization of nanomaterials (www.zyvex.com).

European Union Patents No. DE102007035950 and No. WO2008128532 (Klocke Nanotechnik) disclose a nanorobot module and an exchange adapter for fixing the nanorobot module to a vacuum stage. Similarly, Klcindiek Nanotechnik GmbH, Attocube Systems AG, and SmarAct GmbH also provide SEM nanomanipulation systems with multiple manipulator modules.

SEM nanomanipulation systems have also been developed in university laboratories, usually by assembling commercially available nanopositioning devices into a multi-degree-of-freedom manipulator. Since magnetic fields interfere with SEM imaging, piezoelectric elements are often used to build SEM-compatible actuators. U.S. Pat. No. 6,800,984 (Physik Instrumente GmbH & Co.) discloses a piezoelectric linear drive including a group of piezoelectric actuator stacks configured to drive a member located in a guidance device. U.S. Pat. No. 6,661,153 (Nanomotion Ltd.) discloses a method and apparatus for driving piezoelectric motors by exciting vibrations in a piezoelectric motor having a plurality of electrode sets. U.S. Pat. No. 6,476,537 and No. 6,707,231 (New Focus Inc.) disclose a method and apparatus for controlling a piezoelectric actuator coupled to a driven member. U.S. Pat. No. 5,568,004 and No. 5,994,820 (Kleindiek Nanotechnik GmbH) disclose electromechanical positioning devices based on piezoelectric actuators. Patent WO/2009/037693 (Piezo Nano-Technology Ltd) discloses a piezoelectric rotational motor based on the slick-slip principle.

As an example, by integrating piezoelectric actuators made by New Focus Inc., several SEM nanomanipulation systems with multiple motion units were built, such as (T. Fukuda, M. Nakajima, P. Liu, and H. ElShimy, "Nanofabrication, nanoinstrumentation, and nanoassembly by nanorobotic manipulation," Int. J. Robot. Res., vol. 28, pp. 537-547, 2009), (D. Nakabayashi, P. C. Silva, and D. Ugarte, "Inexpensive two-tip nanomanipulator for a SEM," Appl. Surf. Sci., vol. 254, pp. 405-411, 2007), and (M.-F. Yu, M. J. Dyer, G. D. Skidmore, H. W. Rohrs, X.-K. Lu, K. D. Ausman, J. R. Von Ehr, and R. S. Ruoff, "Three-dimensional manipulation of carbon nanotubes under a scanning electron microscope," Nanotechnol., vol. 10, pp. 244-252, 1999). Different from manipulators being fixed onto a plate, a type of mobile microrobot actuated by piezoelectric discs was developed to move freely on a glass base plate mounted onto the SEM stage (A. Kortschack, A. Shirinov, T. Truper, and S. Fatikow, "Development of mobile versatile nanohandling microrobots: design, driving principle, haptic control," Robotica, vol. 23, 419-434, 2005) (S. Fatikow, T. Wich, H. Hulsen, T. Sievers, and M. Jahnisch, "Microrobot system for automatic nanohandling inside a scanning electron microscope," IEEE/ASME Trans. Mecha., vol. 12, 244-252, 2007). In comparison to fixed micromanipulators, this mobile microrobot has a larger workspace but a poorer positioning resolution.

To interact with a sample, an SEM nanomanipulator should carry an end-effector with both mechanical and electrical connections, such as a probe, AFM cantilever, or gripper. End-effectors are changed frequently primarily because they are prone to damage (e.g., bending and breakage). Since all existing SEM nanomanipulation systems are fastened inside the high-vacuum specimen chamber, exchanging end-effectors necessitates opening of the specimen chamber, which not only contaminates the chamber (thus worse imaging performance) but also incurs a lengthy, time-consuming pump-down process. Therefore, it is desirable if a nanomanipulation system can be transferred into and out of the specimen chamber without breaking the high vacuum.

SUMMARY OF THE INVENTION

In one aspects of the present invention a carrier device is provided for transporting one or more manipulators into a vacuum specimen chamber of an electron microscope, characterized in that the carrier device comprises: (i) a platform having securing means for detachably securing the one or more manipulators to the platform, and (ii) electrical connectors secured to the platform for the electrical connection of the one or more manipulators.

In one aspect of the present invention the carrier device further comprises means for coupling the carrier device to a sample stage of the electron microscope.

In another aspect of the present invention the electron microscope comprises an specimen exchange chamber and wherein the carrier device is configured for transportation into the vacuum specimen chamber through the specimen exchange chamber of the electron microscope thereby keeping the vacuum within the vacuum specimen vacuum chamber.

In yet another aspect of the present invention the carrier device further comprises a base configured for coupling to a sample stage of the electron microscope, and wherein said base includes an engaging portion for releasably connecting said manipulator carrier to an insertion rod, wherein said insertion rod is capable of transporting the carrier device from the exchange chamber to the vacuum specimen chamber.

In a further aspect of the present invention the platform of the carrier device further comprises attaching means for releasably coupling to a sample holder.

In yet a further aspect of the present invention the platform of the carrier device includes a space for receiving a sample for imaging and/or manipulation by the one or more manipulators.

In a further aspect yet of the present invention the carrier device further comprises the one or more manipulators detachably secured to the platform.

In another aspects of the present invention a system is provided for transporting one or more manipulators into a vacuum specimen chamber of an electron microscope, characterized in that said system comprises: (a) a carrier device, wherein said carrier device comprises: (i) a platform having securing means for detachably securing the one or more manipulators to the platform, and (ii) electrical connectors secured to the platform for the electrical connection of the one or more manipulators; and (b) one or more complementing electrical connectors secured within the vacuum specimen chamber of the electron microscope, wherein the complementing one or more electrical connectors are configured for mating with the electrical connectors on the carrier device.

In one aspect of the present invention, the system for transporting one or more manipulators into the vacuum chamber is characterized in that the carrier device further comprises means for coupling the carrier device to a sample stage of the electron microscope.

In another aspect of the present invention, the system for transporting one or more manipulators into the vacuum chamber is characterized in that the carrier device further comprises one or more manipulators detachably secured to the platform.

In yet another aspect of the present invention, the system for transporting one or more manipulators into the vacuum chamber is characterized in that the electron microscope comprises an specimen exchange chamber and wherein the carrier device is configured for transportation into the vacuum specimen through the specimen exchange chamber of the electron microscope thereby keeping the vacuum within the specimen vacuum chamber.

In another aspect yet of the present invention, the system for transporting one or more manipulators into the vacuum chamber is characterized in that the carrier device further comprises a base configured for coupling to a sample stage of the electron microscope, and wherein said base includes an engaging portion for releasably connecting said carrier device to an insertion rod, wherein said insertion rod is capable of transporting the manipulator carrier from the exchange chamber to the vacuum specimen chamber.

In a further aspect of the present invention, the system for transporting one or more manipulators into the vacuum chamber is characterized in that the system further comprises mounting means attached to a sample stage of the electron microscope for securing the complementing electrical connectors within the vacuum specimen chamber, wherein said mounting means is configured to avoid interference with components of the electron microscope.

In yet a further aspect of the present invention, the system for transporting one or more manipulators into the vacuum chamber is characterized in that the complementing electrical connectors further include guiding means for guiding the mating of the one or more electrical connectors on the carrier device with the complementing one or more electrical connectors.

In a further aspect yet of the present invention, the system for transporting one or more manipulators into the vacuum chamber is characterized in that the platform further comprises attaching means for releasably coupling to a sample holder.

In another aspect of the present invention, the system for transporting one or more manipulators into the vacuum chamber is characterized in that the platform includes a space for receiving a sample for imaging and/or manipulation.

In yet another aspect of the present invention, the system for transporting one or more manipulators into the vacuum chamber is characterized in that the system further comprises a decoupling system within the vacuum chamber for decoupling a sample placed on the platform of the carrier device from movements of the carrier device by the sample stage, wherein said decoupling system includes means for lifting the sample placed on the space of the platform, and wherein said decoupling system is capable of supporting the sample for manipulation and imaging.

In another aspect yet of the present invention, the system for transporting one or more manipulators into the vacuum chamber is characterized in that the platform further includes one or more holes, and wherein the decoupling system comprises one or more posts capable of extending through the one or more holes to lift the sample placed on the space and to support the sample for manipulation and imaging.

In a further aspect of the present invention, the system for transporting one or more manipulators into the vacuum chamber is characterized in that the decoupling system further includes driving means operatively connected to the one or more posts for lifting or lowering the one or more posts.

In another aspect of the present invention a system is provided for the manipulation of samples inside a vacuum specimen chamber of an electron microscope, characterized in that said system comprises: (a) a carrier device, wherein the carrier device comprises: (i) a platform having securing means for detachably securing one or more manipulators to the platform, and (ii) electrical connectors secured to the platform for the electrical connection of the one or more manipulators; and (b) one or more complementing electrical connectors secured within vacuum specimen chamber of the electron microscope, wherein the complementing one or more electrical connectors are configured for mating with the electrical connectors on the carrier device.

In one aspect of the present invention, the system for the manipulation of samples is characterized in that the electron microscope comprises an specimen exchange chamber and wherein the carrier device is configured for transportation into the vacuum specimen through the specimen exchange chamber of the electron microscope thereby keeping the vacuum within the specimen vacuum chamber.

In another aspects of the present invention a method is provided for transporting one or more manipulators to a vacuum specimen chamber of an electron microscope without altering the vacuum within the vacuum specimen chamber, wherein said electron microscope comprises a specimen exchange chamber, characterized in that the method comprises the following steps: (a) providing a carrier device, wherein the carrier device comprises: (i) a platform with the one or more manipulators detachably secured therein, and (ii) electrical connectors secured to the platform for the electrical connection of the one or more manipulators; (b) placing the carrier device with the one or more manipulators in the exchange chamber; and (c) transporting the carrier device from the specimen exchange chamber into the vacuum specimen chamber.

In one aspect, the method for transporting the one or more manipulators to the vacuum specimen chamber is characterized in that the platform further comprises attaching means for releasably coupling to a sample holder, and wherein prior to step (b) said method further comprises attaching a sample holder carrying a sample to the attaching means.

In one aspect, the method for transporting the one or more manipulators to the vacuum specimen chamber is characterized in that the platform further comprises attaching means for releasably coupling to a sample holder, and said method further comprises: (d) transporting a sample holder carrying a sample to the vacuum specimen chamber through the specimen exchange chamber, and (e) attaching the sample to holder to the attaching means of the platform within the vacuum specimen chamber.

Advantages of the devices, systems and method of the present invention over the prior art include:
1. Mounting and demounting of manipulators, including nanomanipulators, as well as exchanging end-effectors do not affect the high vacuum of the specimen chamber, in comparison with all existing manipulation/nanomanipulation systems.
2. Because the vacuum specimen chamber is not opened for mounting/demounting of manipulators/nanomanipulators or end-effector exchange, less contamination occurs to the vacuum environment, resulting in better imaging performance.
3. No long pumping-down time because the vacuum in the specimen chamber is not released, which provides significant convenience in practice.
4. The design of the devices and systems of the invention does not interfere regular use of the electron microscope, including scanning electron microscope (SEM) for imaging/analysis, providing a high degree of flexibility. Users who require manipulation/nanomanipulation inside an SEM and those who only use the SEM for imaging/analysis (without the need of manipulation/nanomanipulation) can use the same SEM without interfering each other's work.
5. The devices and systems of the present invention provide a means for a sample of a large area such as a whole semiconductor wafer to be probed/manipulated, enabling a standard SEM to perform tasks that only a specialized instrument presently can perform.

BRIEF DESCRIPTION OF THE DRAWINGS

A brief description of one or more embodiments is provided herein by way of example only and with reference to the following drawings, in which.

Figure 1:
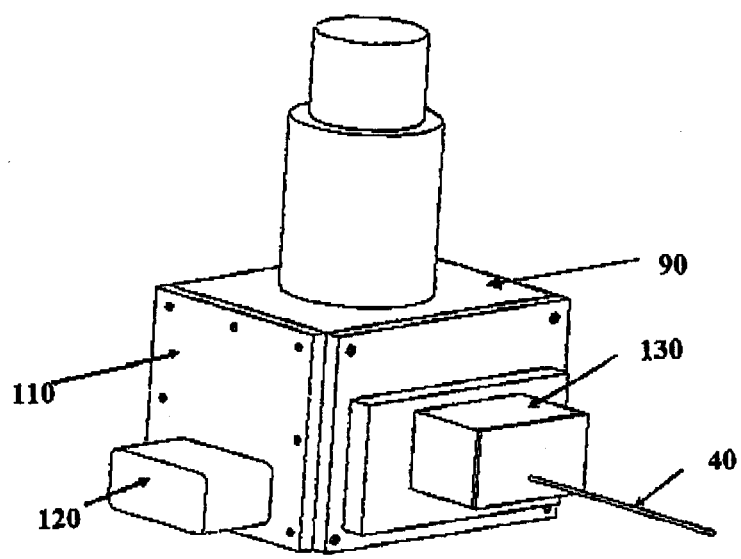
FIG. 1 illustrates the exterior of a scanning electron microscope (SEM).

In the drawings, one or more embodiments of the present invention are illustrated by way of example. It is to be expressly understood that the description and drawings are only for the purpose of illustration and as an aid for understanding, and are not intended as a definition of the limits of the present invention.

DETAILED DESCRIPTION OF THE INVENTION

Unless defined otherwise, all technical and scientific terms used herein have the same meaning as commonly understood by one of ordinary skill in the art to which this invention belongs. Also, unless indicated otherwise, except within the claims, the use of "or" includes "and" and vice-versa. Non-limiting terms are not to be construed as limiting unless expressly stated or the context clearly indicates otherwise (for example "including", "having" and "comprising" typically indicate "including without limitation"). Singular forms including in the claims such as "a", "an" and "the" include the plural reference unless expressly stated otherwise. All publications cited in this document are incorporated herein by reference.

The invention will be explained in details by referring to the figures.

The present invention relates to devices, systems, and methods that allow the transport of one or more manipulators into and out of an electron microscope without disturbing the high vacuum in the specimen chamber of electron microscopes (EM).

As such, the present invention provides a more efficient and more EM-compatible approach to the installation of manipulators inside an EM. The present invention allows a device carrier carrying one or several manipulators to be transferred into and out of a vacuum specimen chamber of the EM through the specimen exchange chamber. Therefore, the mounting and demounting of the manipulator carrier inside the vacuum specimen chamber does not affect the high vacuum of the specimen chamber. Nor does the exchange of end-effectors (i.e., end tools mounted on manipulators) affect the high vacuum of the specimen chamber.

In one aspect of the invention, a carrier device is provided for transporting and placing one or more manipulators within an EM is characterized in that the carrier device comprises: (i) a platform for the one or more manipulators, and (ii) one or more electrical connectors for electrically connecting the carried one or more manipulators to electrical components within the EM.

In another aspect of the Invention, a system for transporting one or more manipulators into a vacuum specimen chamber of an electron microscope, characterized in that said system comprises: (a) a carrier device, wherein said carrier device comprises: (i) a platform having securing means for detachably securing the one or more manipulators to the platform, and (ii) electrical connectors secured to the platform for the electrical connection of the one or more manipulators; and (b) one or more complementing electrical connectors secured within the vacuum specimen chamber of the electron microscope, wherein the complementing one or more electrical connectors are configured for mating with the electrical connectors on the carrier device.

In another aspect of the invention, a system is provided for the manipulation of samples inside a vacuum specimen chamber of an electron microscope, characterized in that said system comprises: (a) a carrier device, wherein the carrier device comprises: (i) a platform having securing means for detachably securing one or more manipulators to the platform, and (ii) electrical connectors secured to the platform for the electrical connection of the one or more manipulators; and (b) one or more complementing electrical connectors secured within vacuum specimen chamber of the electron microscope, wherein the complementing one or more electrical connectors are configured for mating with the electrical connectors on the carrier device.

The following discussion and examples concentrate on the application of the present invention in a scanning electron microscope (SEM) scenario. However, a person skilled in the art would comprehend these and other alternative implementations of the present invention as a natural extension of the present invention. For example, the device, systems, and methods of the present invention may be used in any EM that includes a vacuum specimen chamber and a specimen exchange chamber, including a transmission electron microscope and a reflection electron microscope.

In this document, the term "manipulator" is used in a broad sense to include devices that test, treat or operate on a sample at a micrometer or nanometer scale, which could, but does not necessarily, result in modifications of the sample. For example, the manipulator may aid in observing a characteristic of the sample.

Figure 5:
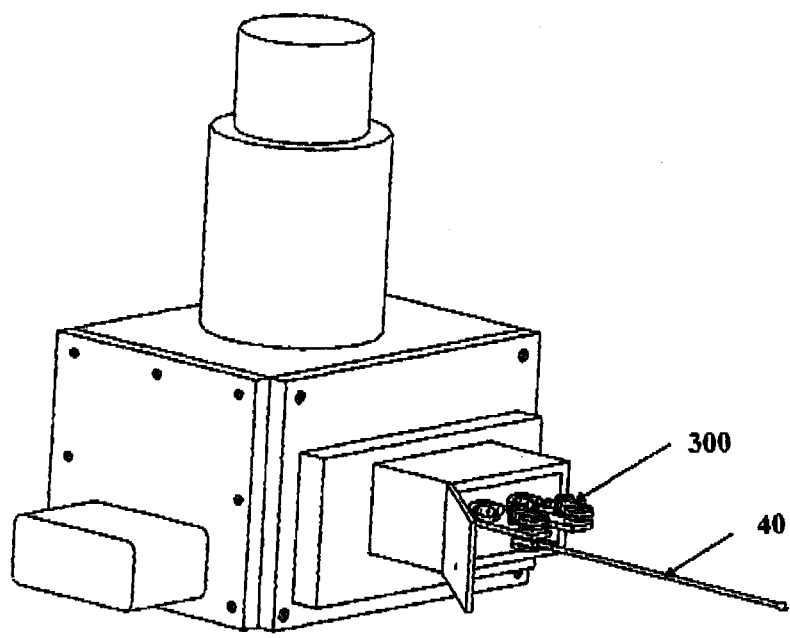
FIG. 5 illustrates a manipulator carrier according to one aspect of the present invention attached to an exchanging rod for its transfer into the specimen exchange chamber.
Figure 8:
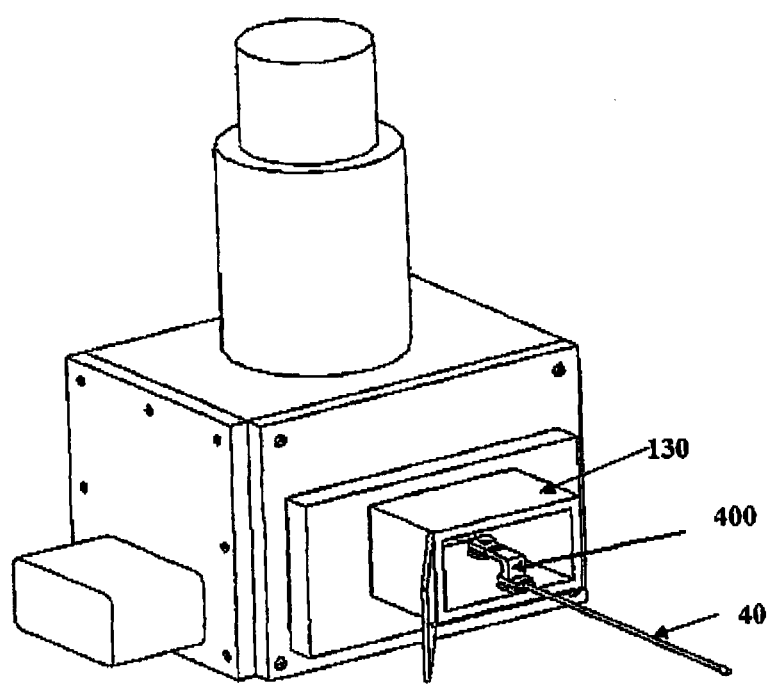
FIG. 8 illustrates that a specimen adapter (sample holder) with a specimen stub being installed to the exchanging rod and placed in position within the specimen exchange chamber.
Figure 10:
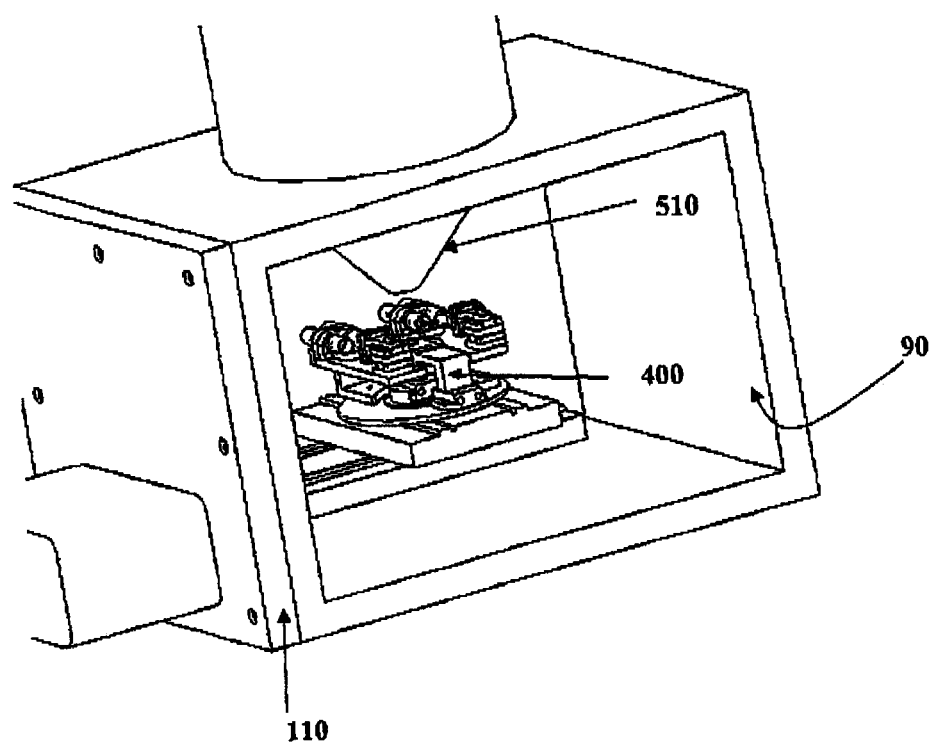
FIG. 10 illustrates that the specimen adapter remains on the manipulator carrier while the exchanging rod has been pulled out.

FIG. 1 illustrates the exterior of a typical SEM. The vacuum specimen chamber 90 (the interior of which is shown in FIG. 10) is a vacuum specimen chamber where a sample is placed for imaging. The vacuum specimen chamber 90 includes a sample stage 50. The driving means (electric motors) that enable movement of the stage 50 within the vacuum sample chamber 90 are typically located in a box 120 located outside of the vacuum specimen chamber 90 of the SEM to avoid electromagnetic interference with the electron beam, The specimen exchange chamber 130 (the interior of which is shown in FIGS. 5 and 8) is a temporary staying space for the specimen during specimen exchange such that the high vacuum in the specimen chamber 90 will not be affected. To transfer a specimen (which may also be referred to as "sample") into or out of the vacuum specimen chamber 90, a specimen adapter (which may also be referred to in the art as "sample holder") is attached to an end of an exchanging rod 40, which can be manually pushed and pulled to slide the specimen adapter through the specimen exchange chamber 130 and into the vacuum specimen chamber 90. In existing systems of the prior art, moving a nanomanipulation system into and out of the vacuum specimen chamber 90 or to change manipulators' end-effectors requires the door 110 of the high-vacuum specimen chamber 90 to be opened each time, which results in contamination of the specimen chamber 90 and disruption of the vacuum, which in turns necessitates a lengthy pump-down process. The present invention describes novel systems, methods, and devices for moving one or more manipulator in and out of the vacuum specimen chamber 90 without opening the specimen chamber door 110, thereby keeping the vacuum within the specimen chamber 90.

Figure 2:
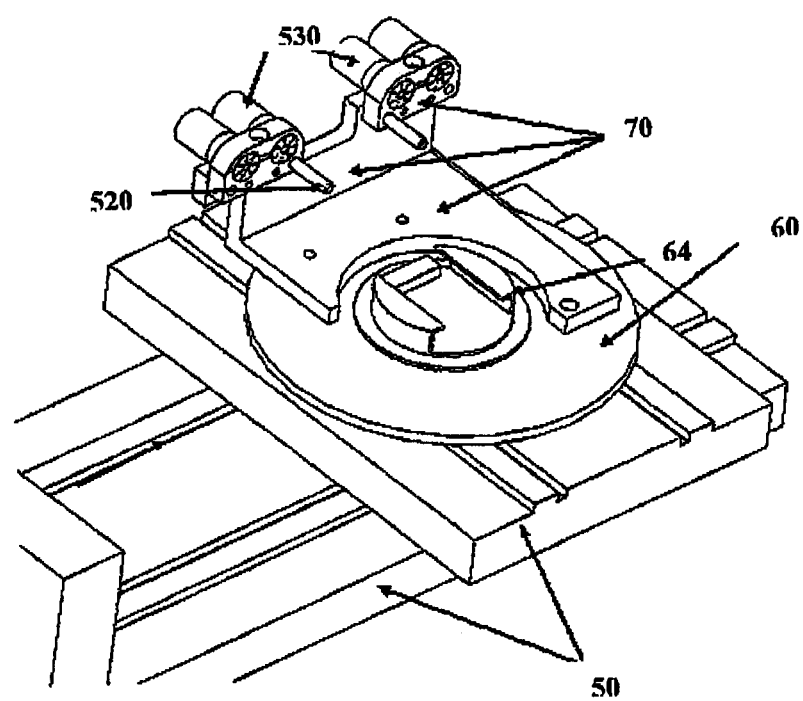
FIG. 2 illustrates the interior SEM stage with adapter mounts and electrical connectors installed for mating with a manipulator carrier of the present invention.

Inside the specimen chamber 90, as illustrated in FIG. 2, an adapter mount 60 can be used to detachably secure a specimen adapter to slot 64 of adapter mount 60 thereby coupling the specimen adapter to the SEM sample stage 50 for regular SEM imaging/analysis of a specimen. Sample stage 50 can be a motorized stage capable of moving in XY directions for localization of sample or targets of interest within the sample, and in the vertical Z direction for focusing of the sample. The present invention takes advantage of the adapter mount 60 for detachably securing the carrier device of the invention for transporting and placing one or more manipulators inside the EM, which means that no special structures for fixing the carrier device of the invention need to be designed and installed so that the accommodation of the manipulation system does not affect the regular use of the SEM.

Figure 3:
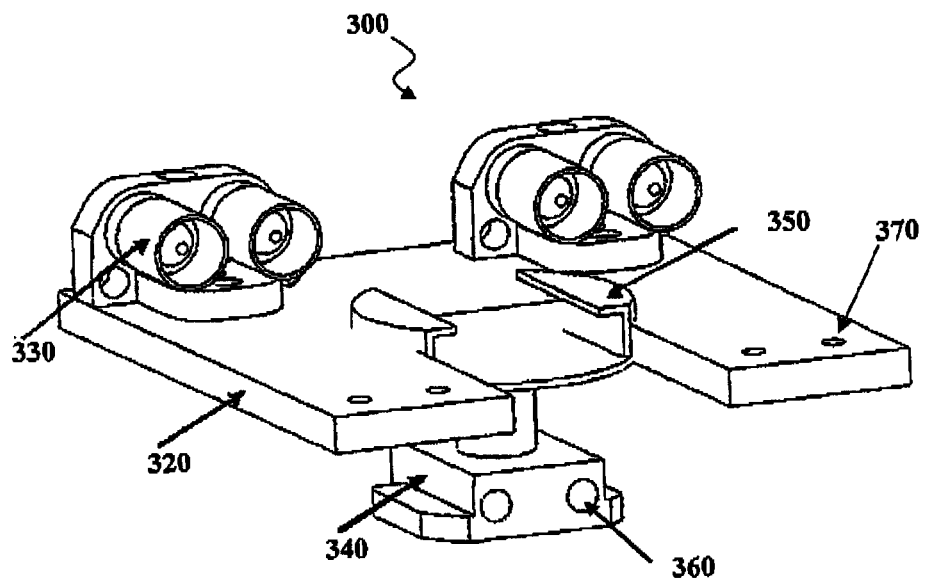
FIG. 3 illustrates a manipulator carrier according to one aspect of the present invention.

FIG. 3 illustrates an aspect of the manipulator carrier device 300 of the present invention, which provides a means to transfer tools, such as nanomanipulators, together with electrical connections for the nanomanipulators into the EM. In one aspect of the invention, a carrier device 300 for transporting and placing one or more manipulators within an EM is provided. In this aspect, the carrier device 300 comprises: (i) a carrier platform 320, and (ii) one or more electrical connectors 330 for electrically connecting the carried one or more manipulators to electrical components within the EM. The electrical connectors 330 on the plate 320 electrically connect the carried tools to the electronics and electrical components located inside and outside of the SEM as further described below.

The device 300 may further comprise securing means 370 for securing the one or more manipulators to the platform 320. Securing means 370 enable the manipulators to be detachably secured to the platform 320. Securing means 370 include, for example, fasteners such as screws or bolts.

The device 300 may further comprise means for mounting the device 300 to the SEM. As such, the carrier device 300 may comprise a base adapter, such as a T-base adapter 340 adapted for coupling to the SEM within the vacuum specimen chamber 90. For example, base adapter 340 can be configured to couple with slot 64 of the SEM specimen stage 50 for fixation of the whole carrier device 300 to the stage 50. The base adapter 340 may also be provided with an engaging means 360 for releasably connecting the carrier device 300 to the insertion or exchanging rod 40, such that the manipulator carrier 300 can be transferred into and out of the vacuum specimen chamber 90 as further described below.

Figure 4:
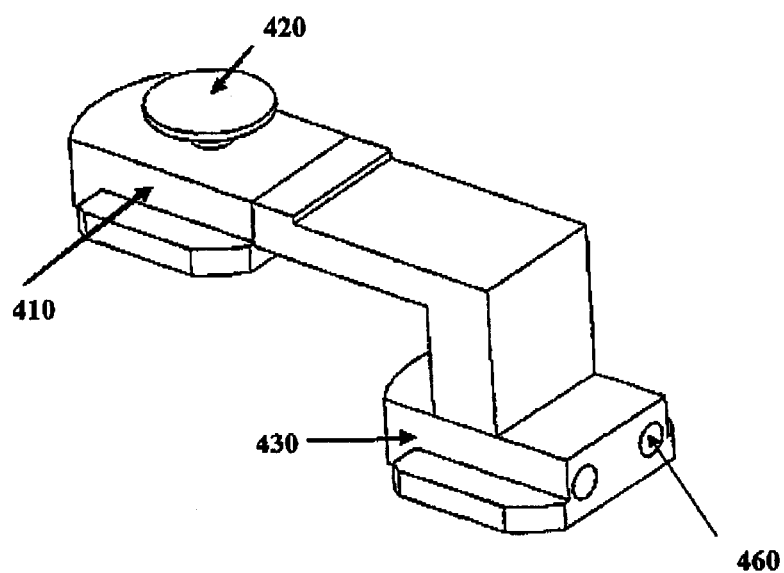
FIG. 4 illustrates a sample holder according to one aspect of the present invention.

The platform 320 of the device 300 may also include a slot or holder mount 350 having a configuration similar to slot 64 for receiving a sample holder for manipulation. There are two ways to place a specimen for manipulation depending on whether it is needed to transfer the specimen together with or separately from the manipulator carrier device 300. Firstly, a specimen adapter, for example a T-base specimen adapter carrying a specimen stub on top (not shown) can be inserted to the holder mount 350 of the manipulator carrier 300 and transferred into the SEM with the manipulator carrier device 300 altogether. Secondly, a specimen adapter, for example the specimen adapter 400 illustrated in FIG. 4, can be used to transfer a specimen into the vacuum specimen chamber 90 of the SEM after the manipulator carrier 300 has been installed within the chamber 90. With reference to FIG. 4 the specimen adapter 400 comprises a T-base adapter 410 and a transfer adapter 430. To transfer the specimen adapter 400 into the specimen chamber 90 already housing the carrier device 300, the exchange rod 40 can be releasably attached to engaging means 460 located at transfer adapter 430. Transfer adapter 430 can also take the form of a T-base adapter, as shown in FIG. 4. The T-base adapter 410 is inserted to the slot 350 of the manipulator carrier device 300 for fixation of the specimen adapter 400 to the carrier device 300. A specimen may then be placed on the specimen stub 420, which is mounted to the T-base adapter 410. Although in the disclosure provided herein the adapters are described as T-base adapters, it is understood that other type of adapters may be used with the instant invention.

Figure 6:
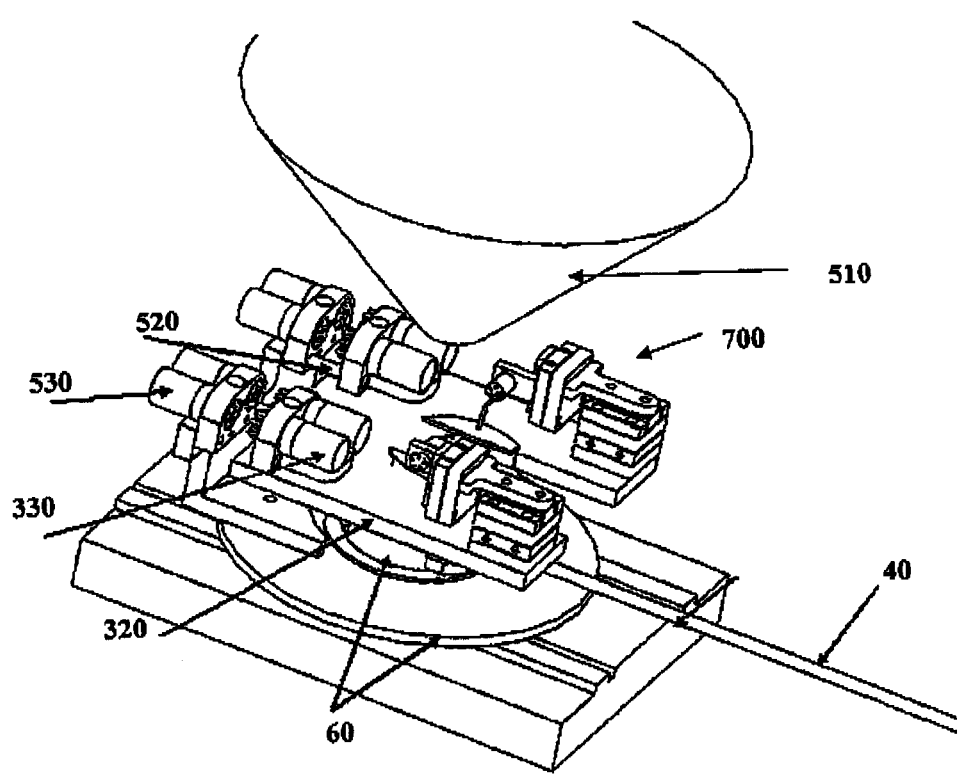
FIG. 6 illustrates a manipulator carrier according to one aspect of the present invention being transferred into the vacuum specimen chamber by the exchanging rod.

With reference to FIGS. 2 and 6 concerning the electrical connection for the manipulators, complementing electrical connectors 530 capable of mating with electrical connectors 330 can be secured within the specimen chamber 90, for example to a mount 70, which is attached to the SEM stage 50. The shape of the adapter mount 70 should be designed to avoid its interference with components of the SEM, for example, to avoid its collision with micro switches, which are intended for limiting the motion of the SEM stage. Additionally, the adapter mount 70 should not block additional SEM detectors for other analyses of a specimen, such as an EDX detector. The complementing electrical connectors 530 may also include guiding means. Guidance posts 520 on the complementing electrical connectors 530 may be designed to be inserted into the electrical connectors 330 so that the electrical connectors 330 on the carrier platform 320 can be strictly aligned and smoothly mated with the complementing electrical connectors 530 on the adapter mount 70. The cables (not shown) from the complementing electrical connectors 530 can be connected to a feed-through port of the SEM and then to electrical components (e.g., manipulator drivers/controllers) located outside the SEM. To accommodate the complementing electrical connectors 530, the specimen chamber door 110 is opened only once in order to install the adapter mount 70 carrying the complementing electrical connectors 530 and cables, whose presence does not affect the regular use of the SEM and hence can be permanent. Although FIGS. 2 and 6 illustrate female complementing electrical connectors 530, which are shown to connect to male connectors 330 of the manipulators, it should be understood that the complementing electrical connectors 530 may be male connectors which can mate with female connectors 330 on the carrier platform 320. Any suitable type of connectors may be used with the present invention, including for example plug and socket connectors or PCI Express connectors.

After installing the adapter mount 70 for the complementing connectors 530 and cables inside the specimen chamber 90, the manipulator carrier device 300 carrying one or more manipulators can now be transferred into the vacuum specimen chamber 90 just like a regular SEM specimen adapter. In FIG. 5, the door of the specimen exchange chamber 130 is opened, and the device 300 with one or more manipulators 700 (FIG. 3 illustrates two manipulators) and electrical connectors 330 on board, connected to the exchanging rod 40, is mounted to the specimen exchange chamber 130. The door of the specimen exchange chamber 130 is closed and the air is evacuated.

Figure 7:
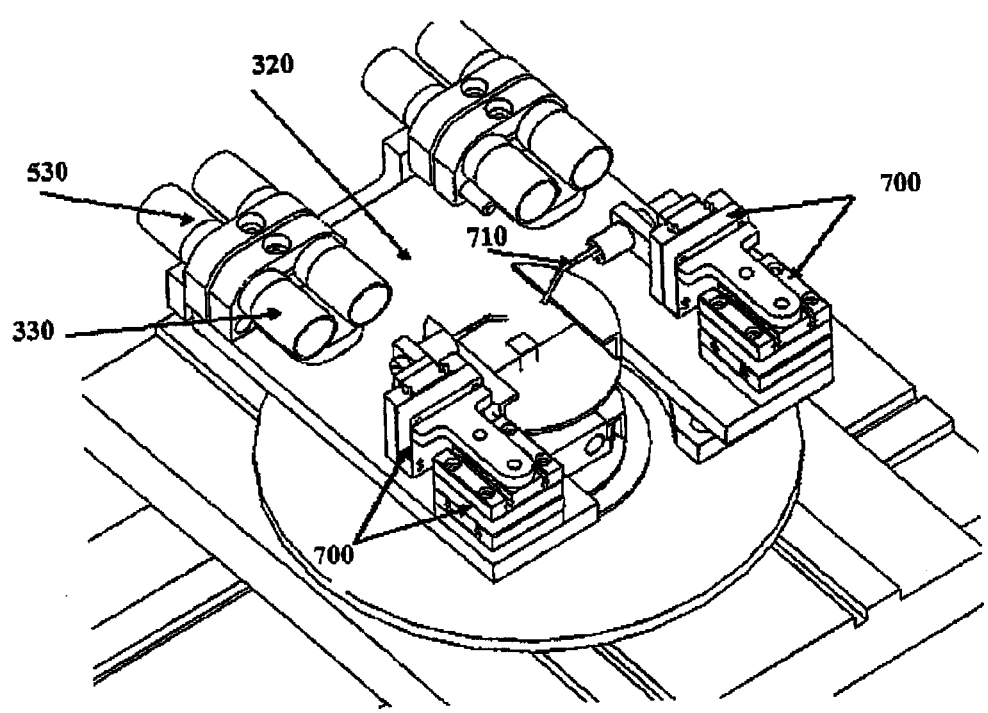
FIG. 7 illustrates that a manipulator carrier according to one aspect of the present invention establishing connections to the adapter mount and electrical connectors.

Once the evacuation of specimen exchange chamber is completed the vacuum specimen chamber 90 is opened, the exchanging rod 40 transfers the manipulator carrier device 300 into the high-vacuum specimen chamber 90, as shown in FIGS. 6 and 7, without disturbing the vacuum of the specimen chamber 90. The adapter 340 of the carrier device 300 can slide into a slot 64 in the adapter mount 60, and simultaneously the connectors 330 on the manipulator carrier device 300 mate with the complementing connectors 530 with or without the assistance of the guidance posts 520 for alignment. The height of the manipulator carrier device 300 should be designed in mind that the manipulators as well as the specimen should be at a proper distance from the objective lens 510, especially when the SEM stage is raised to its highest position for the shortest working distance to observe the specimen.

After the transfer of the carrier device 300, the exchanging rod 40 can be removed from the carrier device 300 and pulled out, as shown in FIG. 7.

Figure 9:
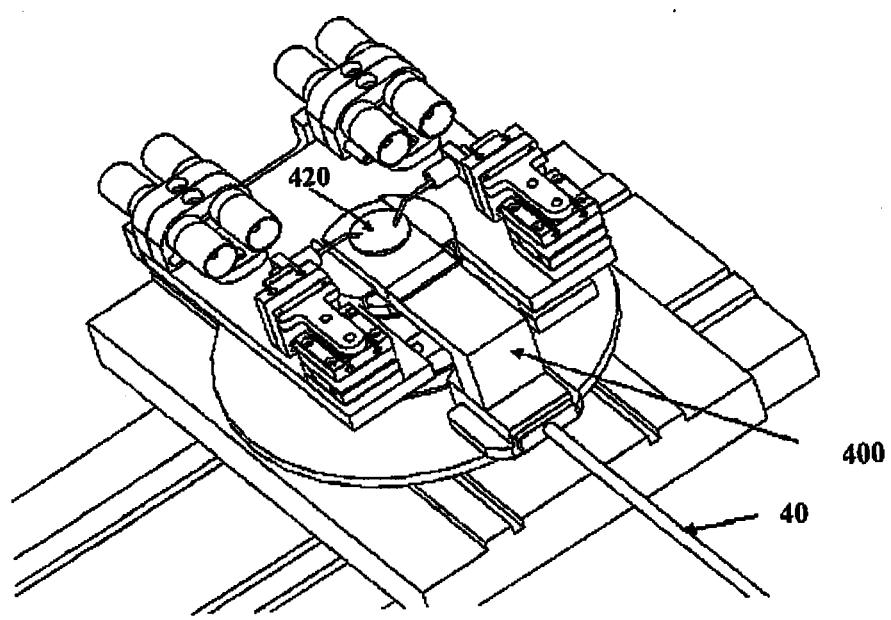
FIG. 9 illustrates that the specimen adapter is coupled to the manipulator carrier within the vacuum specimen chamber.

FIG. 8 illustrates the transfer of the specimen adapter 400 into the specimen exchange chamber 130 having rod 40 attached to it. Rod 40 slides the adapter 400 into the vacuum specimen chamber 90 without disturbing the vacuum. The adapter 400 slides until it couples with slot 350 (FIG. 9). Then rod 40 is retrieved leaving the specimen adapter 400 coupled to the carrier device 300 with manipulators 700 on board ready to manipulate the sample on the specimen adapter 400 (FIG. 10).

The manipulator 700 may be composed of piezoelectric motors/actuators and can move along X, Y, and Z directions or produce rotational motions. The positioners within the manipulator can operate in both coarse and fine positioning modes with or without closed-loop position feedback from integrated high-resolution encoders. An end tool (i.e., end-effector), for example, a probe 710 may be installed on the manipulator 700. The probe 710 may also have electrical connection to the male connectors 330, Other types of end effecters, such as a gripping tool and pipettes, can also be installed for manipulation tasks.

The manipulators and end-effectors are electrically connected via connectors 330 and 530, to electrical components outside the SEM, and eventually to a computer. The manipulators are controlled via a joystick/keypad or a computer program by a human operator, who constantly monitors SEM images. Additionally, automatic closed-loop control for a manipulation task can also be realized using the feedback from SEM as a vision sensor as well as the integrated position/force sensors of the manipulators and end-effectors.

Besides manipulating small-sized specimen (e.g., biological materials such as cells, nanowires, nanotubes, and microelectromechanical systems—MEMS devices), the carrier device 300 of the present invention can also be tailored to be used in a system for manipulating relatively large samples, such as a whole semiconductor wafer or biological tissues.

When probing relatively small samples, the manipulators 700 on the platform 320 are capable of reaching all sites or points of interest within the sample for manipulation. However, when probing relatively large samples the manipulators may not be able to reach all sites or points of interest within the sample for manipulation. The carrier device 300 can be moved in XY directions by the EM's sample stage 50 to which it is attached. If the sample is attached to the carrier device 300, then movement of the carrier device results in a corresponding movement of the sample. Thus, in another aspect of present invention, a novel and unique system that allows the manipulators to reach all sites or points of interest within a relatively large specimen, such as a whole semiconductor wafer is provided. According to this aspect of the invention, a system is provided by which the relatively large sample, like a wafer, can be decoupled from the movement of the carrier device 300 by the sample stage 50, thereby allowing the manipulators 700 the ability to reach all sites and points of interest within the wafer for manipulation.

Figure 11:
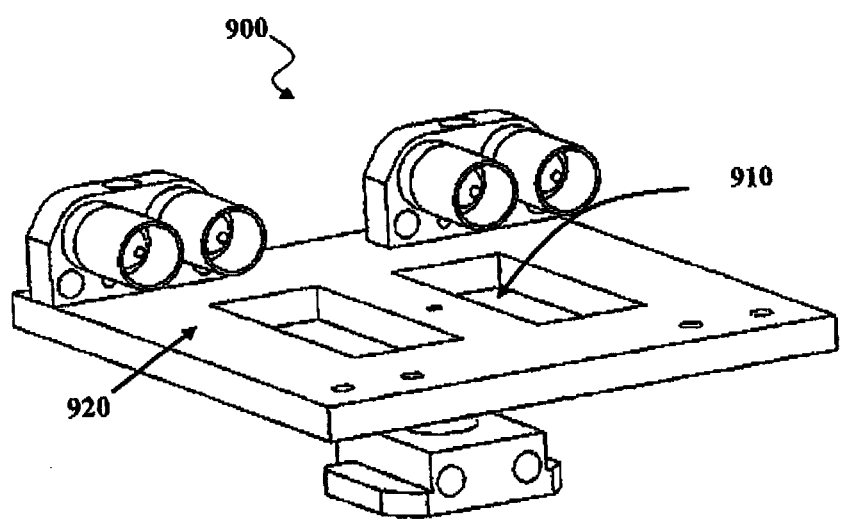
FIG. 11 illustrates a manipulator carrier according to another aspect of the present invention.

FIG. 11 illustrates a carrier device 900 configured for probing relatively large samples. The relatively large sample, such as a wafer, can be placed at the center of the manipulator carrier platform 920, where there are two or more throughholes 910 that allow supporting posts underneath the manipulator carrier 900 to move upwards, through the throughhole 910, contact the wafer and move it vertically off the manipulator carrier platform 920, thereby decoupling the wafer from the XY movement of the carrier 900 about the wafer. In this manner, manipulators 700 on the platform 920 are capable of reaching all points within the wafer for manipulation.

As such, in another aspect, the present invention provides for a system for decoupling a sample from the movement of the stage 50 and carrier device 900 carrying one or more manipulators 700 on board. In aspects, the decoupling system for decoupling the sample to be manipulated from the movement of the carrier device 900 comprises one or more supporting posts capable of lifting a sample placed on the carrier platform 920, and supporting the sample for manipulation and imaging. Driving means operatively connected to the one or more posts can be used for lifting or lowering the one or more posts.

Figure 12:
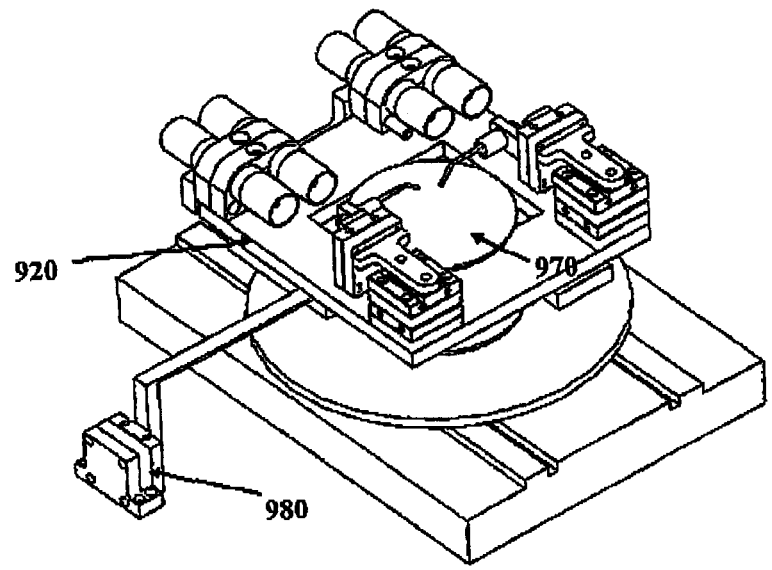
FIG. 12 illustrates a wafer-probing setup where a z-motor is installed to the SEM chamber for the purpose of lifting the wafer placed on the manipulator carrier.
Figure 13:
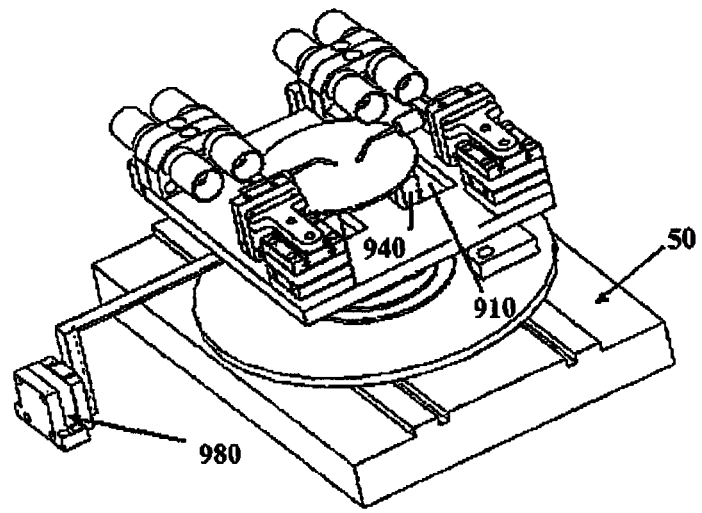
FIG. 13 illustrates that the z-motor drives the wafer off the manipulator carrier via a link and four supporting posts.

As shown in FIGS. 12 and 13, a wafer 970 can be placed on the modified manipulator carrier device 900 having one or more throughholes 910 at the center of the carrier platform 920. The one or more holes 910 are sized to allow movement through one or more supporting means, such as posts 940. Driving means, such as a piezoelectric motor 980 can be installed to the wall or the bottom of the vacuum specimen chamber 90 or to any other suitable, stationary structure within the vacuum specimen chamber 90 of the SEM. Via a lever and the supporting means 940, the motor 980 can lift the wafer 970 off the carrier platform 920, as illustrated in FIG. 13. Therefore, when the SEM stage 50 moves the manipulator carrier device 900 along the X and Y directions, the workspace of the end effectors can cover the whole wafer since the wafer is decoupled from the SEM stage 50 in terms of XY motions, Thus, the motion system of the present invention enhances the capability of a standard SEM for semiconductor wafer probing.

The present invention also provides for methods for transporting one or more manipulators to the vacuum specimen chamber 90 of an electron microscope without altering the vacuum within the vacuum specimen chamber 90. A method according to one aspect of the present invention comprises the following steps:

(a) providing a carrier device 300, 900 wherein the carrier device comprises: (i) a carrier platform 320 with the one or more manipulators 700 detachably secured therein, and (ii) electrical connectors 330 secured to the carrier platform 320 for the electrical connection of the one or more manipulators 700;

(b) placing the carrier device 330, 900 with the one or more manipulators 700 in the specimen exchange chamber 130; and (c) transporting the carrier device 300, 900 from the specimen exchange chamber 130 into the vacuum specimen chamber 90.

Figure 14:
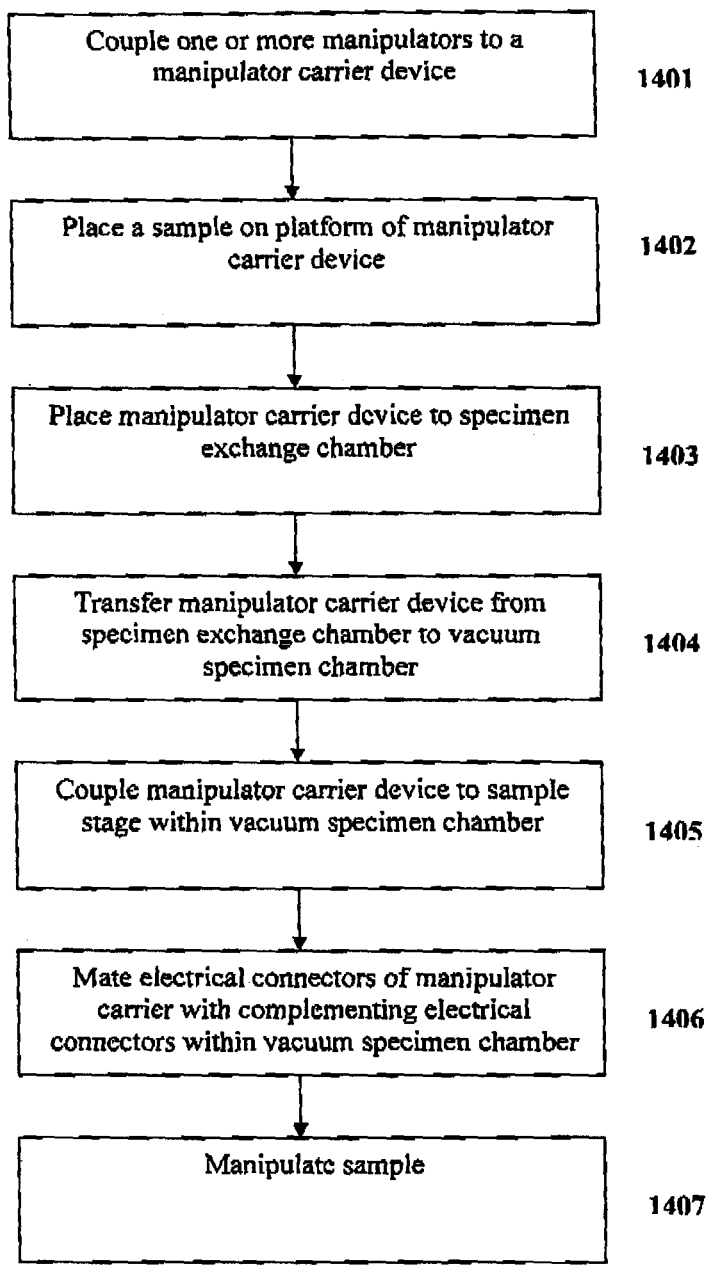
FIG. 14 is a block chart illustrating an example of a method according to one aspect of the present invention.
Figure 15:
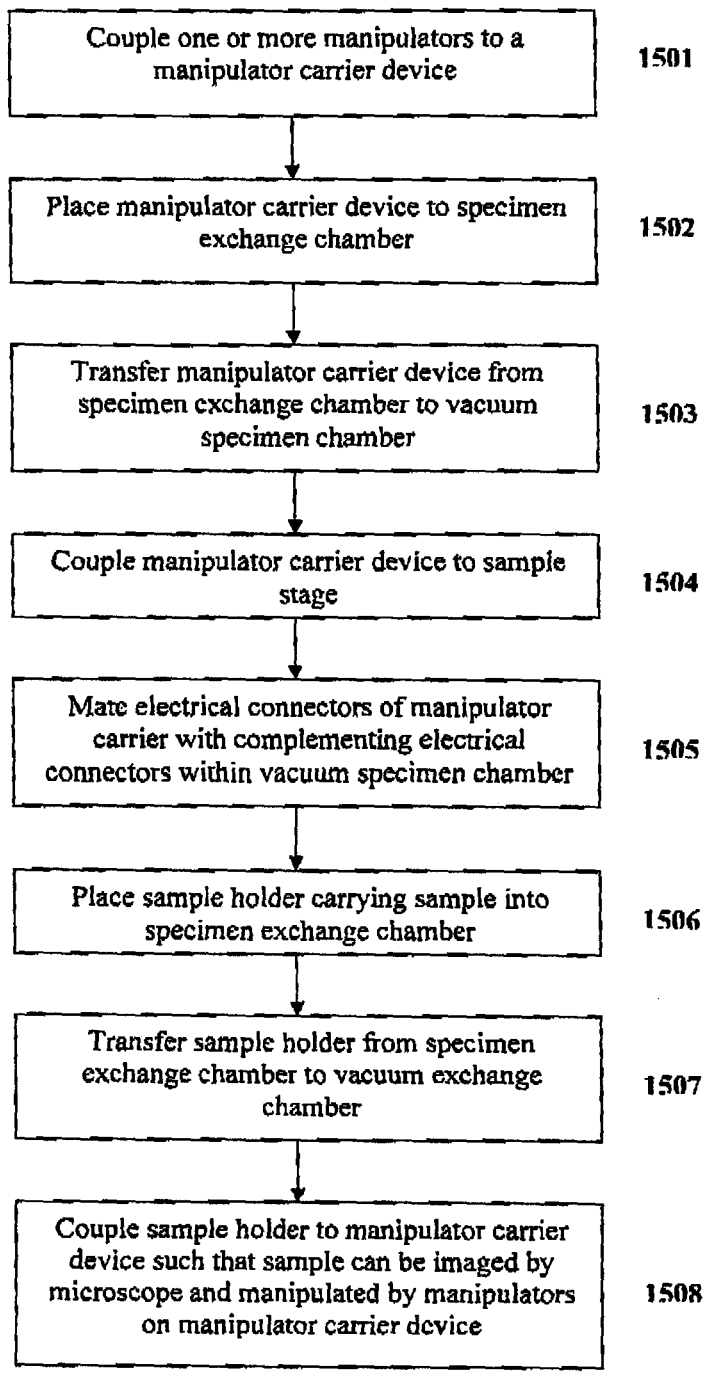
FIG. 15 is a block chart illustrating an example of a method according to another aspect of the present invention.

Flow charts of FIGS. 14 and 15 illustrate two non-limiting examples of methods for transporting the carrier device 300, 900 of the present invention into the vacuum specimen chamber 90 of an EM without disrupting the vacuum within the vacuum chamber 90.

FIG. 14 illustrates an example of a method for transporting the carrier device 300, 900 wherein the sample to be manipulated is transferred to the specimen vacuum chamber 90 together with the carrier device 300, 900. In block 1401 a user selects manipulators and couple/secure the manipulators to the carrier device 300, 900. In block 1402 a sample can be placed directly on the carrier platform or a specimen adapter carrying the sample can be inserted into slot 350. In block 1403 the exchanging rod is attached to the carrier device 300, 900 and the carrier device 300, 900 is mounted within the specimen exchange chamber 130. The specimen exchange chamber 130 is closed and evacuated. Once the exchange chamber 130 is evacuated, the exchanging rod is used to slide or transfer the carrier device 300, 900 into the specimen chamber 90 (block 1404). Within the vacuum specimen chamber 90 the base 340 of the carrier device 300, 900 is engaged or coupled to the slot 64 on the sample stage 50 thereby coupling the carrier device 300, 900 to sample stage 50 (block 1405). Simultaneously with the step of block 1405, the electrical connectors 330 on the carrier device 300, 900 are coupled with the complementing electrical connectors 530 positioned on the adapter mount 70 (block 1406). The rod 40 is detached and retracted. The manipulators are now functional and ready to manipulate the sample (block 1407).

FIG. 15 illustrates another example of a method for transporting a carrier device 300, wherein a specimen adapter (sample holder) 400 can be used to transfer a specimen to the specimen vacuum chamber 90 after the manipulator carrier has been installed within the vacuum specimen chamber 90. Blocks 1501-1505 illustrate the steps for coupling the carrier device 300 to the stage 50 and mating the electrical connectors 330 with complementing connectors 530 in a manner similar to blocks 1401-1406 except that a sample has not been placed on the platform of the manipulator carrier device 300. An exchanging rod 40 is attached to a sample holder 400 having a specimen placed on stub 420, and the sample holder 400 is mourned to the specimen exchange chamber 130. Once the specimen exchange chamber 130 is evacuated, the door communicating to the specimen vacuum chamber 90 is opened and the rod 40 is used to slide the sample holder 400 into the vacuum specimen chamber 90 onto the holder mount 350 on the carrier device 300 thereby placing the sample in position for imaging and manipulation after the rod 40 is retracted.

It will be appreciated by those skilled in the art that other variations of the one or more embodiments described herein are possible and may be practiced without departing from the scope of the present invention.

The invention claimed is:

1. A manipulator carrier device for use in combination with an electron microscope of the type comprising a vacuum specimen chamber, a sample stage within the vacuum specimen chamber, and an specimen exchange chamber, wherein the manipulator carrier device comprises: (i) a platform having (a) securing means for detachably securing the one or more manipulators to a top surface of the platform, and (b) a sample holder mount configured for detachably coupling to a sample holder for carrying the sample, (ii) an adapter attached to a bottom surface of the platform, the adapter including an engaging portion for detachably coupling the manipulator carrier device to the sample stage within the vacuum chamber of the electron microscope, and (iii) electrical connectors secured to the top surface of the platform for the electrical connection of the one or more manipulators to the electron microscope.

2. The carrier device of claim 1, wherein the carrier device is configured for transportation into the vacuum specimen chamber through the specimen exchange chamber of the electron microscope thereby keeping the vacuum within the vacuum specimen vacuum chamber.

3. The carrier device of claim 1, wherein the platform includes a space for receiving a sample for manipulation by the one or more manipulators.

4. The carrier device of claim 1, wherein the carrier device further comprises the one or more manipulators detachably secured to the platform.

5. A system for use in combination with an electron microscope of the type having a vacuum specimen chamber and a specimen exchange chamber, the system for moving one or more manipulators between the vacuum specimen chamber and the specimen exchange chamber, wherein said system comprises:
(a) a manipulator carrier device, wherein said manipulator carrier device comprises: (i) a platform having (a) securing means for detachably securing the one or more manipulators to a top surface of the platform, and (b) a sample holder mount configured for detachably coupling to a sample holder for carrying the sample such that the sample holder can be transferred together with the manipulator carrier device carrying the manipulators, (ii) a carrier base adapter attached to a bottom surface of the platform, the carrier base adapter including an engaging portion for coupling the manipulator carrier device to the stage within the vacuum chamber of the electron microscope, and (iii) electrical connectors secured to the top surface of the platform for the electrical connection of the one or more manipulators to the electron microscope; and
(b) one or more complementing electrical connectors secured within the vacuum specimen chamber of the electron microscope, wherein the complementing one or more electrical connectors are configured for mating with the electrical connectors on the carrier device.

6. The system of claim 5, wherein the carrier device further comprises one or more manipulators detachably secured to the platform.

7. The system of claim 5, wherein the carrier device is configured for transportation into the vacuum specimen through the specimen exchange chamber of the electron microscope thereby keeping the vacuum within the specimen vacuum chamber.

8. The system of claim 5, wherein the electron microscope further comprises a sample stage, and the complementing electrical connectors are secured to the sample stage, and wherein the system further comprises mounting means attached to a sample stage of the electron microscope for securing the complementing electrical connectors within the vacuum specimen chamber, wherein said mounting means is configured to avoid interference with components of the electron microscope.

9. The system of claim 5, wherein the complementing electrical connectors further include guiding means for guiding the mating of the one or more electrical connectors on the carrier device with the complementing one or more electrical connectors.

10. The system of claim 5, wherein the platform further comprises attaching means for releasably coupling to a sample holder.

11. The system of claim 5, wherein the system further comprises a decoupling system within the vacuum chamber for decoupling a sample placed on the platform of the carrier device from movements of the carrier device by the sample stage, wherein said decoupling system includes means for lifting the sample placed on the space of the platform, and wherein said decoupling system is capable of supporting the sample for manipulation and imaging.

12. The system of claim 11, wherein the platform further includes one or more holes, and wherein the decoupling system comprises one or more posts capable of extending through the one or more holes to lift the sample placed on the space and to support the sample for manipulation and imaging.

13. The system of claim 12, wherein the decoupling system further includes driving means operatively connected to the one or more posts for lifting or lowering the one or more posts.

14. A method for transporting one or more manipulators to a vacuum specimen chamber of an electron microscope without altering the vacuum within the vacuum specimen chamber, said electron microscope comprising a specimen exchange chamber in communication with the vacuum specimen chamber, wherein the method comprises the following steps:
(a) providing a manipulator carrier device, wherein the manipulator carrier device comprises: (i) a platform having one or more manipulators detachably secured therein, (ii) electrical connectors secured to the platform for the electrical connection of the one or more manipulators, and (iii) an adapter for coupling the manipulator carrier device to the electron microscope within the vacuum chamber;
(b) placing the manipulator carrier device having the one or more manipulators in the exchange chamber;
(c) transporting the manipulator carrier device from the specimen exchange chamber into the vacuum specimen chamber; and (d) coupling the adapter of the manipulator carrier device to the vacuum specimen chamber, thereby mounting the manipulator carrier device within the vacuum specimen chamber.

15. The method of claim 14, wherein the platform further comprises attaching means for releasably coupling to a sample holder, and wherein prior to step (b) said method further comprises attaching a sample holder carrying a sample to the attaching means.

16. The method of claim 14, wherein the platform further comprises attaching means for releasably coupling to a sample holder, and said method further comprises:
   (e) transporting a sample holder carrying a sample to the vacuum specimen chamber through the specimen exchange chamber, and
   (f) attaching the sample to holder to the attaching means of the platform within the vacuum specimen chamber.

* * * * *